(12) United States Patent
Ren et al.

(10) Patent No.: US 10,827,636 B2
(45) Date of Patent: Nov. 3, 2020

(54) DISPLAY MODULE, CONTROL METHOD FOR WATERPROOF ASSEMBLY AND DISPLAY DEVICE

(71) Applicant: BOE Technology Group Co., Ltd., Beijing (CN)

(72) Inventors: Yan Ren, Beijing (CN); Zifeng Wang, Beijing (CN); Lei Cao, Beijing (CN); Junmin Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 137 days.

(21) Appl. No.: 16/245,352

(22) Filed: Jan. 11, 2019

(65) Prior Publication Data

US 2019/0350099 A1 Nov. 14, 2019

(51) Int. Cl.
*G06F 1/16* (2006.01)
*H05K 5/00* (2006.01)
(Continued)

(52) U.S. Cl.
CPC ....... *H05K 5/065* (2013.01); *G02F 1/133308* (2013.01); *G06F 3/1446* (2013.01);
(Continued)

(58) Field of Classification Search
CPC .......... H05K 5/065; H05K 5/064; H05K 5/06; H05K 5/00; H05K 7/20954; H05K 7/20963; H05K 7/2039; H05K 7/20; G06F 3/1446; G06F 3/0484; G06F 11/002; G06F 11/3058; G02F 1/133308; G02F 2001/133311
See application file for complete search history.

(56) References Cited

U.S. PATENT DOCUMENTS 5,420,828 A * 5/1995 Geiger .................. A42B 3/042
367/131
8,081,267 B2 * 12/2011 Moscovitch ......... H05K 7/2099
349/58
(Continued)

FOREIGN PATENT DOCUMENTS

CN 203537431 U 4/2014
CN 103957675 A 7/2014
(Continued)

OTHER PUBLICATIONS

First office action of Chinese application No. 201810445220.3 dated Oct. 29, 2019.

*Primary Examiner* — Anthony M Haughton
(74) *Attorney, Agent, or Firm* — Fay Sharpe LLP

(57) ABSTRACT

Provided are a display module, a control method for a waterproof assembly and a display device. The display module comprises a display screen, a front module frame, a waterproof assembly and a controller, wherein the front module frame comprises a first portion and a second portion; the waterproof assembly is located in the gap between the display screen and the first portion. The controller is configured to control the waterproof assembly to raise the temperature when the water content in the gap is within a set water content range. The present disclosure improves the display effect of the display device in the condition of improving the waterproof capability of the display module, which is used in the display device.

20 Claims, 13 Drawing Sheets

(51) Int. Cl.
  *H05K 7/00* (2006.01)
  *H05K 5/06* (2006.01)
  *G02F 1/1333* (2006.01)
  *G06F 3/14* (2006.01)
  *H05K 7/20* (2006.01)

(52) U.S. Cl.
  CPC ............... *H05K 7/20954* (2013.01); *G02F 2001/133311* (2013.01)

(56) References Cited

U.S. PATENT DOCUMENTS

| | | | | |
|---|---|---|---|---|
| 8,102,483 | B2* | 1/2012 | Perry | H05K 5/03 349/58 |
| 2009/0231807 | A1* | 9/2009 | Bouissiere | H05K 7/20972 361/690 |
| 2011/0116016 | A1* | 5/2011 | Mikubo | H05K 7/20963 349/70 |
| 2014/0144083 | A1* | 5/2014 | Artwohl | G02B 6/0063 49/70 |
| 2015/0208539 | A1* | 7/2015 | Blunier | A61B 1/0661 312/223.1 |
| 2016/0016395 | A1* | 1/2016 | Bushnell | B32B 37/1045 156/73.1 |
| 2018/0020579 | A1* | 1/2018 | Chang | H05K 7/202 |
| 2019/0111643 | A1 | 4/2019 | Wang et al. | |
| 2019/0289756 | A1* | 9/2019 | Lee | G09F 15/005 |

FOREIGN PATENT DOCUMENTS

| | | |
|---|---|---|
| CN | 204667362 U | 9/2015 |
| CN | 106413345 A | 2/2017 |
| CN | 107521135 A | 12/2017 |
| KR | 20150068116 A | 6/2015 |

\* cited by examiner

1201 — controlling, through the controller, the waterproof assembly to raise the temperature when the water content in the gap is within a set water content range

FIG. 13

DISPLAY MODULE, CONTROL METHOD FOR WATERPROOF ASSEMBLY AND DISPLAY DEVICE

CROSS-REFERENCE TO RELATED APPLICATION

The present application claims the priority of Chinese Patent Application No. 201810445220.3, filed on May 10, 2018 and entitled "DISPLAY MODULE, CONTROL METHOD FOR WATERPROOF ASSEMBLY AND DISPLAY DEVICE", the contents of which are incorporated herein by reference in its entirety.

TECHNICAL FIELD

The present disclosure relates to the technical field of electronics, and in particular, to a display module, a control method for a waterproof assembly and a display device.

BACKGROUND

As time evolves, display devices have been widely used in production and people's life. In some special scenarios (such as medical scenarios), it is often necessary that the display device has a waterproof function.

The display device includes a display screen and a front module frame. The front module frame is fixed onto an edge of a light-emergent surface of the display screen so as to protect and limit the display screen. In the related art, in order to achieve the waterproof function of the display device, generally, the display screen and the front module frame are covered with protective glass and the edge of the protective glass is sealed.

However, the protective glass affects the transmittance of light emitted from the display screen, which results in a relatively poor display effect of the display device.

SUMMARY

The present disclosure provides a display module, a control method for a waterproof assembly, and a display device. The technical solutions are as follows.

In a first aspect, the present disclosure provides a display module comprising a display screen, a front module frame, a waterproof assembly and a controller, wherein the front module frame comprises a first portion and a second portion; the first portion of the front module frame covers a non-display region of a light-emergent surface of the display screen; the second portion of the front module frame covers a side surface of the display screen; the waterproof assembly is located in the gap between the display screen and the first portion; and the controller is configured to control the waterproof assembly to raise the temperature when the water content in the gap is within a set water content range.

Optionally, the waterproof assembly comprises a deformation component, a detector and a heater; the detector and the deformation component are stacked between the display screen and the first portion of the front module frame in the direction perpendicular to the display screen; the deformation component is configured to deform after absorbing water; the detector is configured to detect pressure received by the detector itself; the heater is configured to heat the deformation component; and the controller is configured to control the heater to heat the deformation component when the pressure detected by the detector is within a set pressure range, wherein the pressure detected by the detector correlates with the water content in the gap and the set pressure range correlates with the set water content range.

Optionally, the deformation component is made of at least one of foam and silica gel.

Optionally, the detector comprises a pressure sensor.

Optionally, the heater comprises a heating resistor and a heat-conducting block; the heating resistor is attached to the heat-conducting block; the heat-conducting block is in contact with the deformation component; and the heating resistor is configured to generate heat under the control of the controller.

Optionally, the heat-conducting block is a block made of aluminium.

Optionally, an orthographic projection of the deformation component on a plane surface of the light-emergent surface is within the light-emergent surface, and the display module further comprises a waterproof layer, and the waterproof layer is located on the surface of the deformation component close to the second portion.

Optionally, an orthographic projection of an edge portion of the deformation component on a plane surface of the light-emergent surface is outside the light-emergent surface, and the display module further comprises a waterproof layer, and the waterproof layer is located on the surface of the edge portion close to the display screen.

Optionally, the waterproof assembly comprises m detectors and n heaters; each of the detectors corresponds to at least one of the heaters; $m \geq 1$ and $n \geq 1$; and the controller is configured to control, when determining that the pressure detected by any of the detectors is within the set pressure range, the heater corresponding to the detector to heat the deformation component.

Optionally, the distribution density of the n heaters is decreased along the direction towards the edge of the display screen.

Optionally, a distance between each of the detectors and the heater which corresponds to the detector is less than a distance between each of the detectors and a heater which does not correspond to the detector.

Optionally, the detectors and the heaters are alternately arranged.

Optionally, at least one of the side facing the first portion of the front module frame and the side facing the light-emergent surface of the display screen, in the deformation component, is provided with an accommodating groove, and the detectors and the heaters are located in the accommodating groove.

Optionally, the accommodating grooves in the deformation component comprise a first accommodating groove and a second accommodating groove which are located at the same side of the deformation component and spaced; the detector is embedded into the first accommodating groove; and the heater is embedded into the second accommodating groove.

Optionally, the first accommodating groove is a cylindrical groove; and the second accommodating groove is a cubic groove.

Optionally, an orthographic projection of the deformation component on the display screen is ring-shaped and surrounds a display region of the display screen.

In a second aspect, the present disclosure provides a control method for a waterproof assembly used in the controller in the display module provided in the first aspect, wherein the waterproof assembly is a waterproof assembly in the display module; and the method comprises: controlling the waterproof assembly to raise the temperature when the water content in the gap is within a set water content range.

Optionally, the waterproof assembly comprises a deformation component, a detector and a heater; said controlling the waterproof assembly to raise the temperature when the water content in the gap is within a set water content range comprises: controlling the heater to heat the deformation component, when the pressure detected by the detector is within a set pressure range, wherein the pressure detected by the detector correlates with the water content in the gap and the set pressure range correlates with the set water content range.

In a third aspect, the present disclosure provides a display device, comprising the display module provided in the first aspect.

In a fourth aspect, the present disclosure provides a use method for a display device, wherein the display device is the display device provided in the third aspect, and the method comprises: controlling, through the controller, the waterproof assembly to raise the temperature when the water content in the gap is within a set water content range.

In a fifth aspect, the present disclosure provides a computer-readable storage medium having an instruction stored therein, wherein when being run on a computer, the computer-readable storage medium causes the computer to execute the method provided in the second or fourth aspect.

In a sixth aspect, the present disclosure provides a computer program product comprising instructions, which causes a computer to execute the method provided in the second or fourth aspect when the computer program product is run on a computer.

In a seventh aspect, the present disclosure provides a controller comprising a processor and a memory; the processor is configured to execute instructions stored in the memory; the processor implements the method provided in the second or fourth aspect by executing the instructions.

BRIEF DESCRIPTION OF THE DRAWINGS

FIG. 13 is a flow chart of a use method for a display device provided in an embodiment of the present disclosure.

DETAILED DESCRIPTION

In order to make the principle of the present disclosure clearer, the embodiments of the present disclosure will be further described in details below with reference to the accompanying drawings.

A display device includes a display module. The display module usually includes a display screen and a front module frame. The front module frame is fixed onto an edge of a light-emergent surface of the display screen so as to protect and limit the display screen. The embodiments of present disclosure provide a display module which has a waterproof effect.

Figure 1:
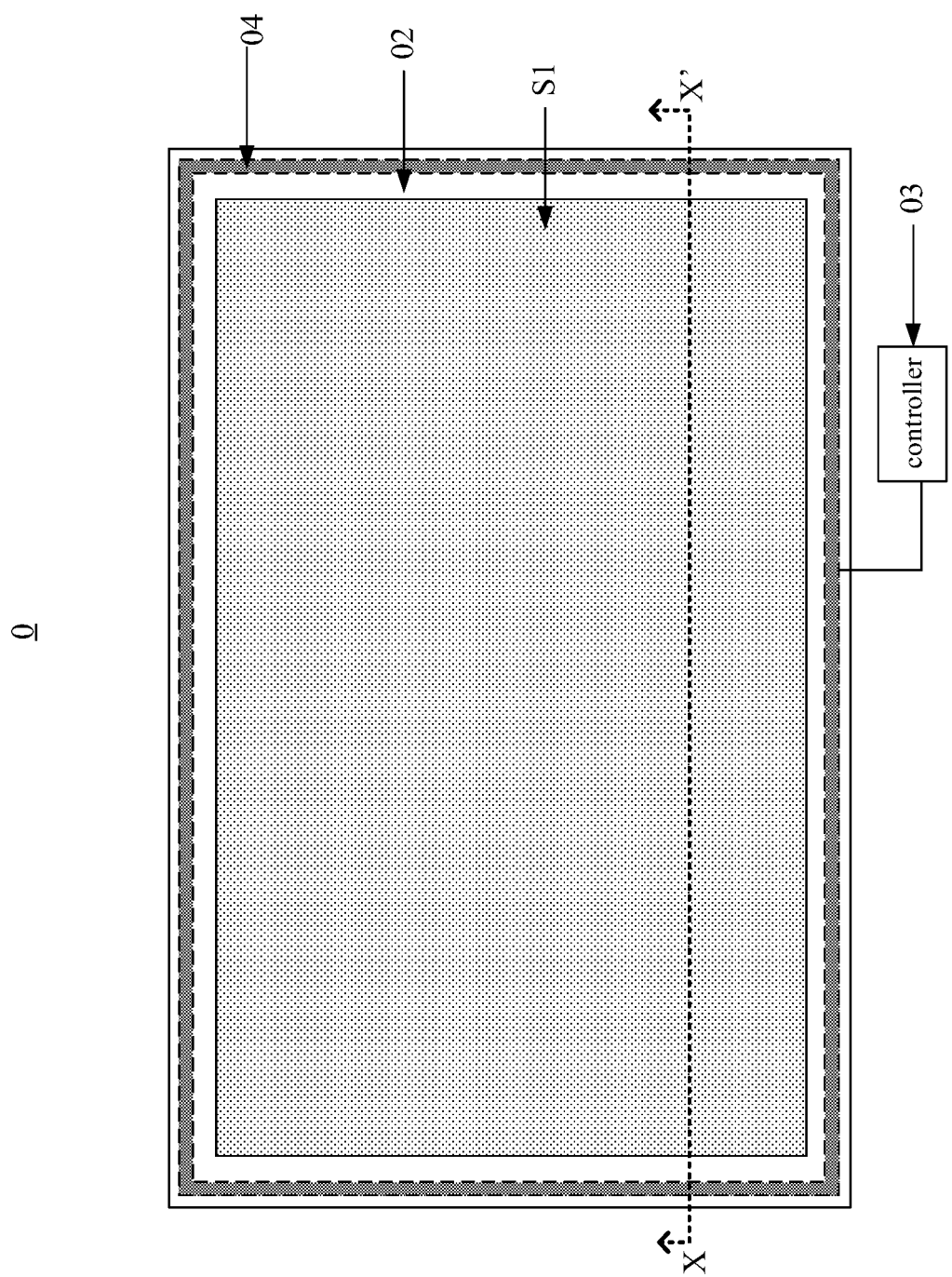
FIG. 1 is a structural diagram of a display module provided in an embodiment of the present disclosure.
Figure 2:
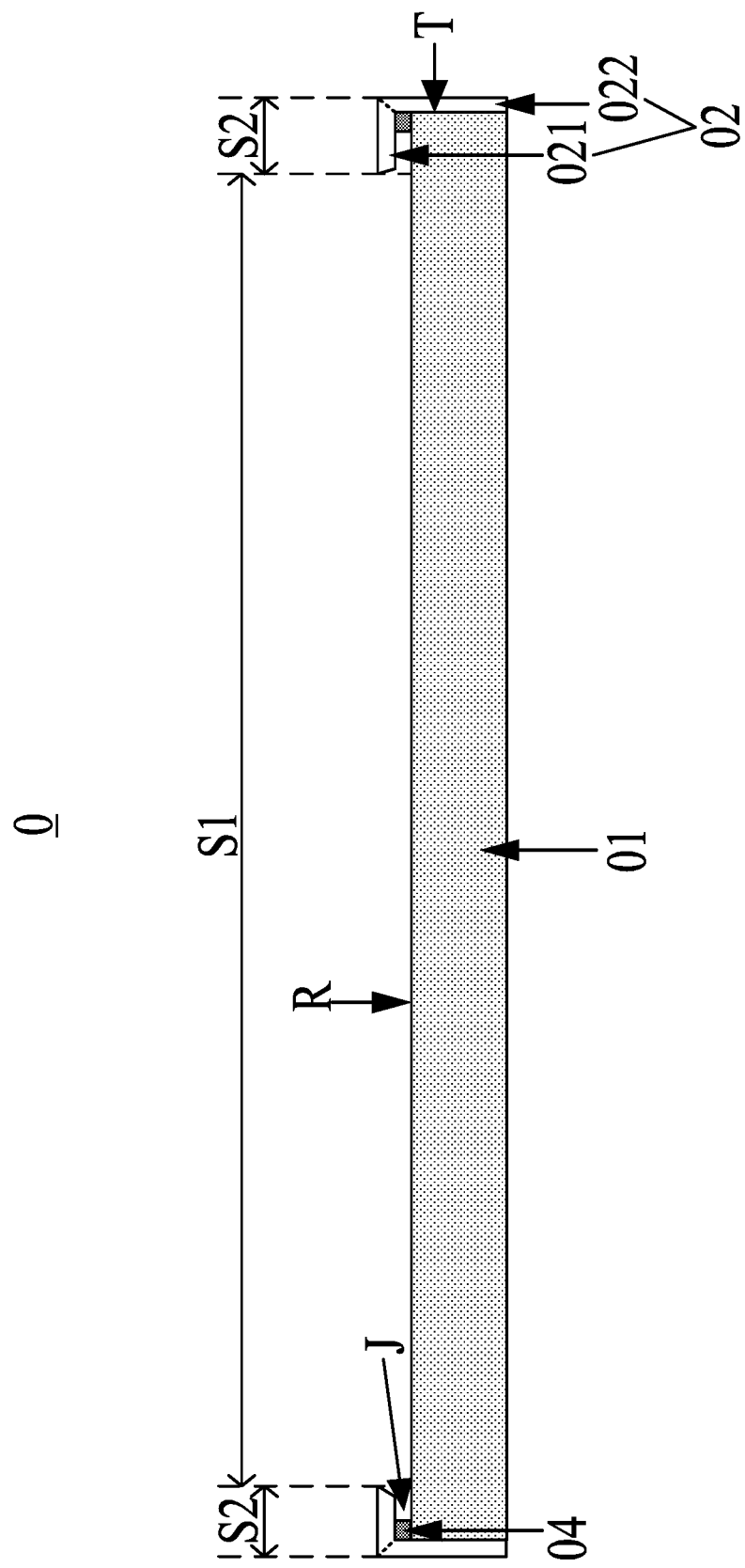
FIG. 2 is a section diagram of the display module shown in FIG. 1.

FIG. 1 is a structural diagram of a display module provided in an embodiment of the present disclosure. FIG. 2 is a diagram of a section XX' of the display module shown in FIG. 1, and the section XX' may be perpendicular to a display screen 01 in the display module.

With reference to FIG. 1 and FIG. 2, the display module 0 may include the display screen 01, a front module frame 02, a controller 03 and a waterproof assembly 04.

The front module frame 02 includes a first portion 021 and a second portion 022. The first portion 021 of the front module frame 02 covers a non-display region S2 of a light-emergent surface R (the side, where the light-emergent surface R of the display screen 01 is located, is a light-emergent side of the display screen) of the display screen 01. The second portion 022 of the front module frame 02 covers a side surface T of the display screen 01.

The waterproof assembly 04 is located in the gap J between the display screen 01 and the first portion 021 of the front module frame 02. The controller 03 is configured to control the waterproof assembly 04 to raise the temperature when the water content in the gap J is within a set water content range.

In summary, in the display module provided in the embodiments of the present disclosure, when there is water on the surface of the display screen of the display module, and the water content in the gap between the display screen and the first portion is within a set water content range, the controller may control the waterproof assembly to heat the gap to remove the water in the gap, thereby preventing the water from entering the display screen. In addition, in this waterproof mode, there is no object attached to the display region of the surface of the display screen, which would not affect the display effect of the display screen.

It should be noted that the display screen 01 has a plurality of surfaces including a light-emergent surface R for emitting light. The light-emergent surface R may include a display region S1, and a non-display region S2 surrounding the display region S1. Since the first portion 021 of the module front frame 02 covers the non-display region S2 of the light-emergent surface R of the display screen 01, only the display region S1 of the light-emergent surface R can be seen in FIG. 1.

Figure 3:
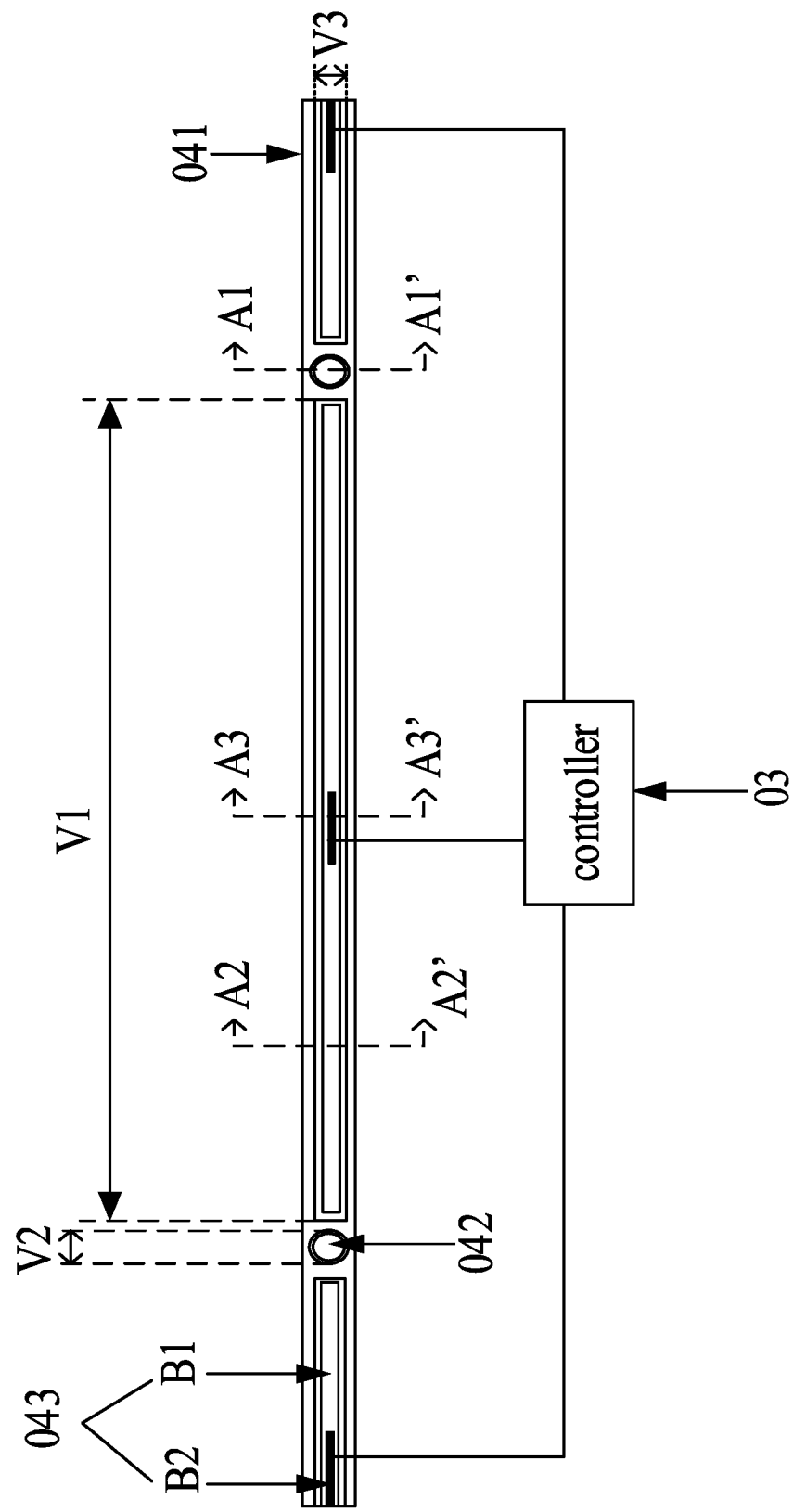
FIG. 3 is a partial structural diagram of a waterproof assembly provided in an embodiment of the present disclosure.

FIG. 3 is a partial structural diagram of a waterproof assembly provided in an embodiment of the present disclosure. FIG. 3 is a view of waterproof assembly from the first portion 021 of the front module frame 02. As shown in FIG. 3. The waterproof assembly may include a deformation component 041, a detector 042 and a heater 043.

Figure 4:
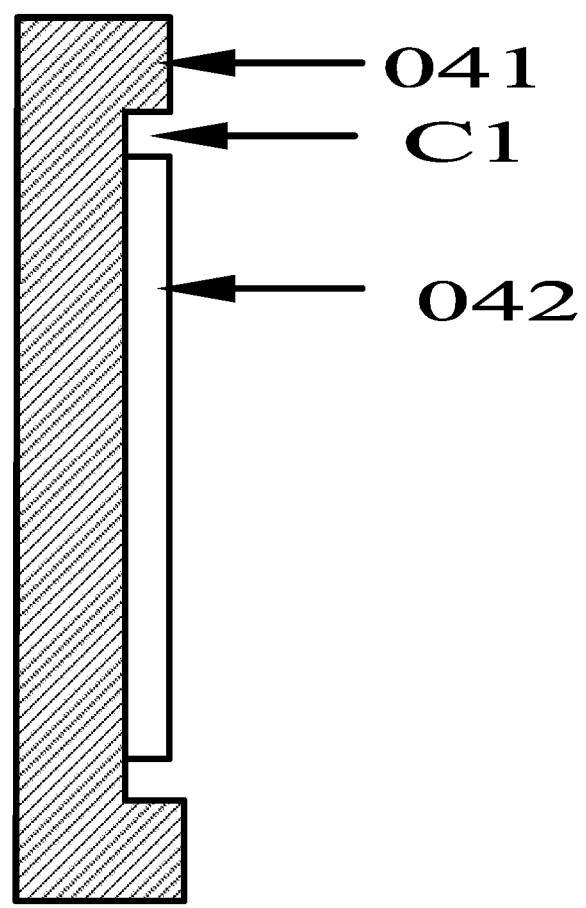
FIG. 4 is a diagram of the section A1A1' in FIG. 3 provided in an embodiment of the present disclosure.

FIG. 4 is a diagram of the section A1A1' in FIG. 3 provided in an embodiment of the present disclosure. By combining FIG. 3 and FIG. 4, the detector 042 and the deformation component 041 are stacked between the display screen 01 and the first portion 021 of the front module frame 02 in the direction perpendicular to the display screen. It should be noted that, the detector 042 may locate between the deformation component 041 and the display screen 01, or between the deformation component 041 and the first portion 021 of the front module frame 02. The embodiment of the present disclosure does not limit to this. The present disclosure takes the structure in which the detector 042 locates between the deformation component 041 and the first portion 021 as an example. The deformation component 041 is configured to deform after absorbing water. The detector 042 is configured to detect pressure received by the detector itself. The heater 043 is configured to heat the deformation component 041 so as to evaporate the water in the deformation component 041.

The controller 03 is configured to control the heater 043 to heat the deformation component 041 when determining that the pressure detected by the detector 042 is within the set pressure range, wherein the pressure detected by the detector 042 correlates with the water content in the gap and the set pressure range correlates with the set water content range.

Exemplarity, when there is water in the gap, the deformation component 041 would deform after absorbing the water. Due to the structure that the deformation component 041 and the detector 042 are stacked together, the pressure applied by the deformation component 041 to the detector 042 would change and be detected by the detector 042. When the change reaches a certain degree, the pressure will fall within the set pressure range. At this time, the controller may control the heater 043 to heat the deformation component 041 so as to heat the gap, thereby removing the water in the gap. In addition, the waterproof effect could be further enhanced by disposing the deformation component 041 in the gap to absorb the water.

Optionally, the detector 042 may include a pressure sensor. Moreover, the deformation of the deformation component 041 after absorbing water may be expansion deformation or other deformation such as shrinkage deformation. The embodiment of the present disclosure does not limit to this.

On the one hand, when the deformation of the deformation component 041 after absorbing water is expansion deformation, the pressure within the set pressure range is relatively large. Since the deformation component 041 and the detector 042 are stacked, the deformation component 041 will further press the detector 042, and the pressure detected by the detector 042 becomes larger. When the pressure rises to a certain degree, the pressure will fall within the set pressure range. At this time, the controller 03 could determine that there is expansion deformation occurred in the deformation component 041. Optionally, in such a case, the deformation component 041 may be made of at least one of foam (such as acrylic foam) and silica gel.

Optionally, the deformation component 041 may be fixed between the display screen 01 and the first portion 021 of the module front frame 02 by double-sided tape. When the deformation component is made from foam, the deformation component 041 with the double-sided tape attached thereon may be referred to as foam tapes. Optionally, the double-sided tape may be stretchable tapes, which are a kind of traceless double-sided tape. After the stretchable tapes are attached to an object, by pulling the stretchable tape in a specific direction, the stretchable tape can be completely separated from the object, and will not leave any trace on the object. By adopting the stretchable tape to fix the deformation component 041 between the display screen 01 and the first portion 021 of the front module frame 02, no trace will be left on the display screen 01 and the first portion 021 when it is necessary to separate the deformation component 041 from the display screen 01 and the first portion 021.

On the other hand, when the deformation of the deformation component 041 after absorbing water is shrinkage deformation, the pressure within the set pressure range is relatively small. Since the deformation component 041 and the detector 042 are stacked, the pressing degree of the deformation component 041 to the detector 042 is decreased, and the pressure detected by the detector 042 will become smaller. When the pressure reduces to a certain degree, the pressure will fall within the set pressure range. At this time, the controller 03 could determine that there is shrinkage deformation occurred in the deformation component.

Optionally, the orthographic projection of the deformation component on the display screen may be ring-shaped and surround the display region of the display screen 01. In this way, the deformation component will absorb the water as long as there is water entering the space between the front module frame and the display screen, so that the waterproof assembly could prevent water from entering any position between the display screen and the front module frame.

Optionally, as shown in FIG. 3, the waterproof assembly may include m detectors 042 and n heaters 043. M detectors 042 correspond to different regions of the deformation component respectively. N heaters 043 also correspond to different regions of the deformation component 041 respectively, and m≥1, n≥1. Each of the detectors 042 may correspond to at least one of the heaters 043. For example, each of the detectors 042 corresponds to the heater 043 adjacent to the detector 042. A distance between each of the detectors 042 and the heater 043 which corresponds to the detector is less than a distance between the detector 042 and the heater 043 which does not correspond to the detector.

The controller may be configured to control, when determining that the pressure received by any of the detectors 042 is within the set pressure range, the heater 043 corresponding to the any of the detector, to heat the deformation component 041.

Optionally, the detectors 042 and the heaters 043 may be alternately arranged (for example, alternately arranged). Exemplarily, by further referring to FIG. 3, a plurality of detectors 042 and a plurality of heaters 043 in the display module may be arranged in a ring and this ring surrounds the display screen. One heater 043 is arranged between every two adjacent detectors 042 in the plurality of detectors 042, and one detector 042 is arranged between every two heaters 043. Namely, in the direction surrounding the display screen, the detectors and the heaters may be alternately arranged. In other conditions, the arrangement manner of the detectors 042 and the heaters 043 may differ from that shown in FIG. 3. For instance, in the display module, the plurality of heaters 043 may be arranged in a plurality of rings which are nested together and all surround the display screen, and the plurality of detectors 042 may also be arranged in a plurality of rings which are nested together and all surround the display screen. In addition, one ring formed from the detectors 042 is arranged between every two rings formed from the heaters 043. Namely, in the direction from the center to the edge of the display screen, the detectors and the heaters may be alternately arranged. The arrangement mode of the heaters and the detectors in the display module may be other arrangement modes. This is not repeated in the embodiments of the present disclosure.

In this way, both the detectors 042 and the heaters 043 may be in a uniform distribution. Thus, the pressure detected by the plurality of detectors 042 may correlate with the deformation in a plurality of positions of the deformation component 041, and the plurality of heaters 043 may heat the plurality of positions of the deformation component 041.

Optionally, n>m, that is, in the display module, the number of the heaters 043 may be larger than the number of the detectors 042. At this time, there are more heaters 043 in the display module and the heating effect of the heaters 043 on the deformation component 041 is better.

Exemplarily, FIG. 3 shows three heaters 043 and two detectors 042 in total. When a portion of the deformation component 041, close to certain detector 042, deforms after absorbing water, the pressure received by the detector 042 increases and is larger than the set pressure threshold. The pressure received by the detector 042 is within the set pressure range. At this time, the controller may control the heater 043 (such as the heater 043 adjacent to the detector 042) corresponding to the detector 042 to heat the deformation component 041 so as to heat the portion of the deformation component 041 close to the detector 042. Thus, water in this portion is evaporated until the pressure received by the detector 042 is not larger than the set pressure threshold, namely, until the pressure received by the detector 042 is outside the set pressure range. In this way, the controller may selectively control the heater 043 to heat the deformation component 041, and there is no need to control all the heaters 043 to heat the deformation component 041 when only partial deformation exists in the deformation component 041, thereby reducing energy consumption.

Figure 5:
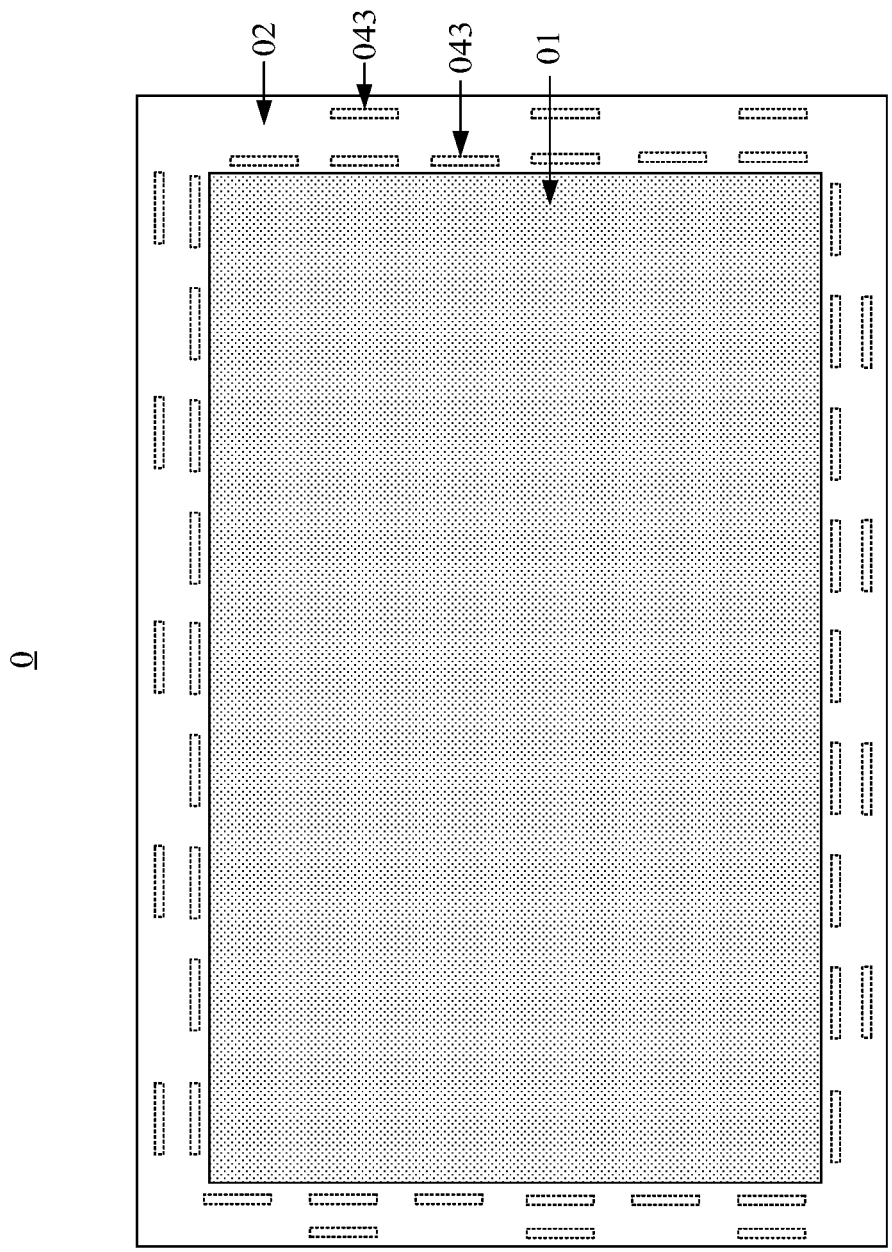
FIG. 5 is a distribution diagram of heaters provided in an embodiment of the present disclosure.

Optionally, FIG. 5 is a distribution diagram of the heaters provided in an embodiment of the present disclosure. As shown in FIG. 5, the distribution density of the heaters 043 in the waterproof assembly may be gradually reduced along the direction towards the edge of the display screen 01. Namely, more heaters 043 may be arranged at the position away from the edge of the display screen (i.e., the position close to the center of the display screen) and fewer heaters 043 may be arranged at the position close to the edge of the display screen (i.e., the position away from the center of the display screen). Since the water enters the display screen in an order from the position away from the edge of the display screen to the position close to the edge of the display screen, there is much water at the position away from the edge of the display screen, in the deformation component, and thus by arranging more heaters at the entry from which the water enters the display screen (i.e., the position away from the edge of the display screen), the water in the deformation component may be effectively removed. Exemplarily, as shown in FIG. 5, the heaters in the display module may form two rings, which are nested together and both surround the display region of the display screen 01. In these two rings, the ring close to the display region of the display screen may be formed from more heaters (for example, taking the 30 heaters 043 in FIG. 5 as an example), and the ring away from the display region of the display screen may be formed from fewer heaters (for example, taking the 15 heaters 043 in FIG. 5 as an example).

Figure 6:
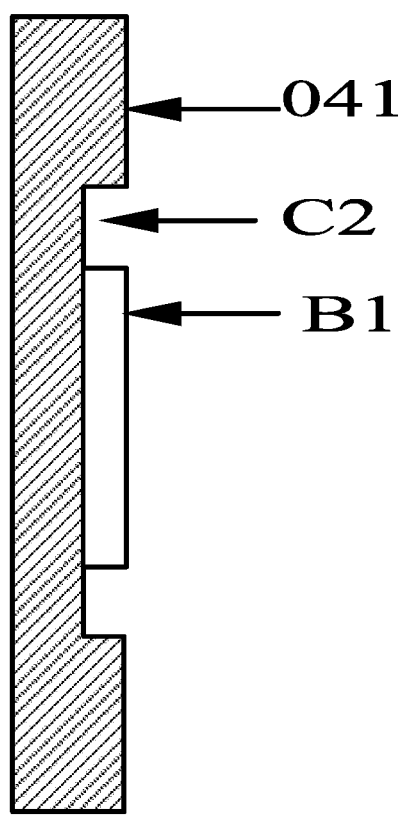
FIG. 6 is a diagram of the section A2A2' in FIG. 3 provided in an embodiment of the present disclosure.
Figure 7:
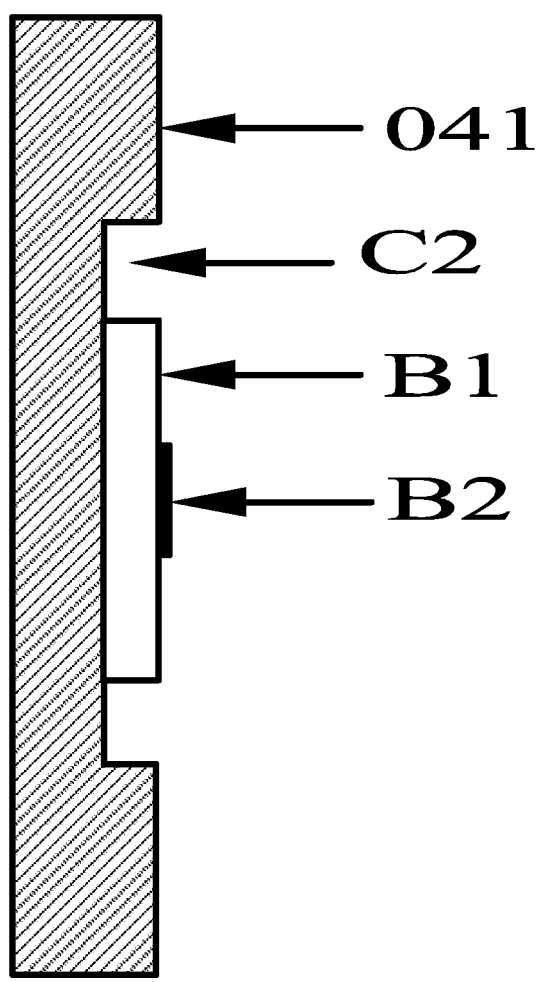
FIG. 7 is a diagram of the section A3A3' in FIG. 3 provided in an embodiment of the present disclosure.

Optionally, the heater 043 in FIG. 3 may include a heat-conducting block B1 and a heating resistor B2. FIG. 6 is a diagram of the section A2A2' in FIG. 3 provided in an embodiment of the present disclosure; and FIG. 7 is a diagram of the section A3A3' in FIG. 3 provided in an embodiment of the present disclosure. As shown in FIG. 6 or 7, the heat-conducting block B1 may be made of aluminum and may be attached to the deformation component 041. As shown in FIG. 7, the heating resistor B2 may be attached to the heat-conducting block B1 and the surface area of the heat-conducting block B1 is larger than that of the heating resistor B2, thereby conducting heat more effectively.

Continuing referring to FIG. 3. The heating resistor B2 is connected with the controller 03 and is configured to generate heat under the control of the controller. In the embodiments of the present disclosure, the controller may cause the heating resistor to generate heat by applying a voltage to the heating resistor, so that the heat-conducting block B1 attached to the heating resistor B2 may conduct the heat generated by the heating resistor B2 to the deformation component. Optionally, the heater 043 may merely include the heating resistor B2, but not a heat-conducting block B1. The embodiment of the present disclosure does not limit to this.

Optionally, the temperature, to which the controller 03 controls the heater 043 to heat the deformation component 041, does not exceed 60 degrees. Namely, by controlling the upper limit of the heating temperature of the heater 043 to the deformation component 041, the controller 03 prevent damage to the display screen caused by excessive heating.

It should be noted that the detector 042 and the deformation component 041 may be stacked between the display screen and the first portion of the front module frame in the direction perpendicular to the display screen. Both the detector 042 and the heater 043 may be arranged between the deformation component 041 and the first portion of the front module frame. For example, the side of the deformation component 041, facing the first portion of the front module frame 02, may be provided with accommodating grooves. Both the detector 042 and the heater 043 may be located in the accommodating grooves.

Exemplarily, the accommodating grooves in the deformation component 041 may include a first accommodating groove C1 (as shown in FIG. 4) and a second accommodating groove C2 (as shown in FIG. 6 or 7). The detector 042 is embedded into the first accommodating groove C1. The heater 043 is embedded into the second accommodating groove C2. The first accommodating groove C1 and the second accommodating groove C2 may be located at the same side of the deformation component 041 and spaced. In addition, when the waterproof assembly includes m detectors and n heaters, the accommodating grooves in the deformation component 041 may include m first accommodating grooves, in which the m detectors are embedded, and n second accommodating grooves, in which the n heaters are embedded. Optionally, the first accommodating groove C1 may be a cylindrical groove (the bottom surface of the cylindrical groove is circular); the second accommodating groove C2 may be a cubic groove (such as a cuboid groove, the bottom surface of the cubic groove is rectangular). Or the first accommodating groove C1 and the second accommodating groove C2 are in a shape matching with the shapes of the detector 042 and the heater 043. Optionally, both the bottom surfaces of the first accommodating groove C1 and the second accommodating groove C2 may have other shapes. For example, the bottom surface of the first accommodating groove C1 is rhombic and the bottom surface of the second accommodating groove is trapezoidal. The embodiment of the present disclosure does not limit to this.

Optionally, when the bottom surface of the first accommodating groove C1 is circular and the bottom surface of the second accommodating groove C2 is rectangular, the length direction V1 of the rectangle may be parallel to the side surface of the display screen close to the second accommodating groove. The diameter V2 of the circle may be less than the length V1 of the rectangle and larger than the width V2 of the rectangle.

Figure 8:
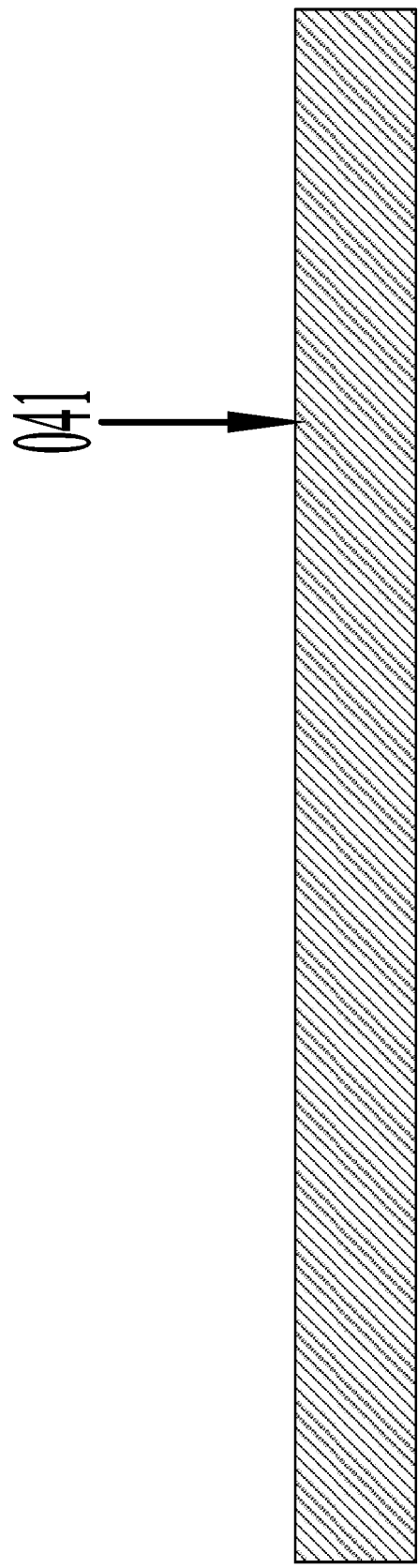
FIG. 8 is a view of the side, away from the front module frame, of the deformation component in FIG. 3 provided in an embodiment of the present disclosure.

FIG. 8 is a view of the side, away from the front module frame, of the deformation component in FIG. 3 provided in an embodiment of the present disclosure. It can be seen from FIG. 8 that the side of the deformation component, away from the front module frame (i.e., the side close to the display screen), is not provided with groove. Optionally, both the detector and the heater may also be arranged between the deformation component and the display screen. At this time, the side of the deformation component, facing the display screen, may be provided with the above accommodating groove and the side of the deformation component, facing the front module frame, may not be provided with accommodating groove. Alternatively, the side of the deformation component, facing the display screen, may be provided with the above accommodating groove and the side of the deformation component, facing the front module frame, may also be provided with the accommodating groove. The embodiment of the present disclosure does not limit to this. Namely, at least one of the side of the deformation component facing the first portion of the front module frame and the side facing the light-emergent surface of the display screen is provided with the accommodating groove.

Figure 9:
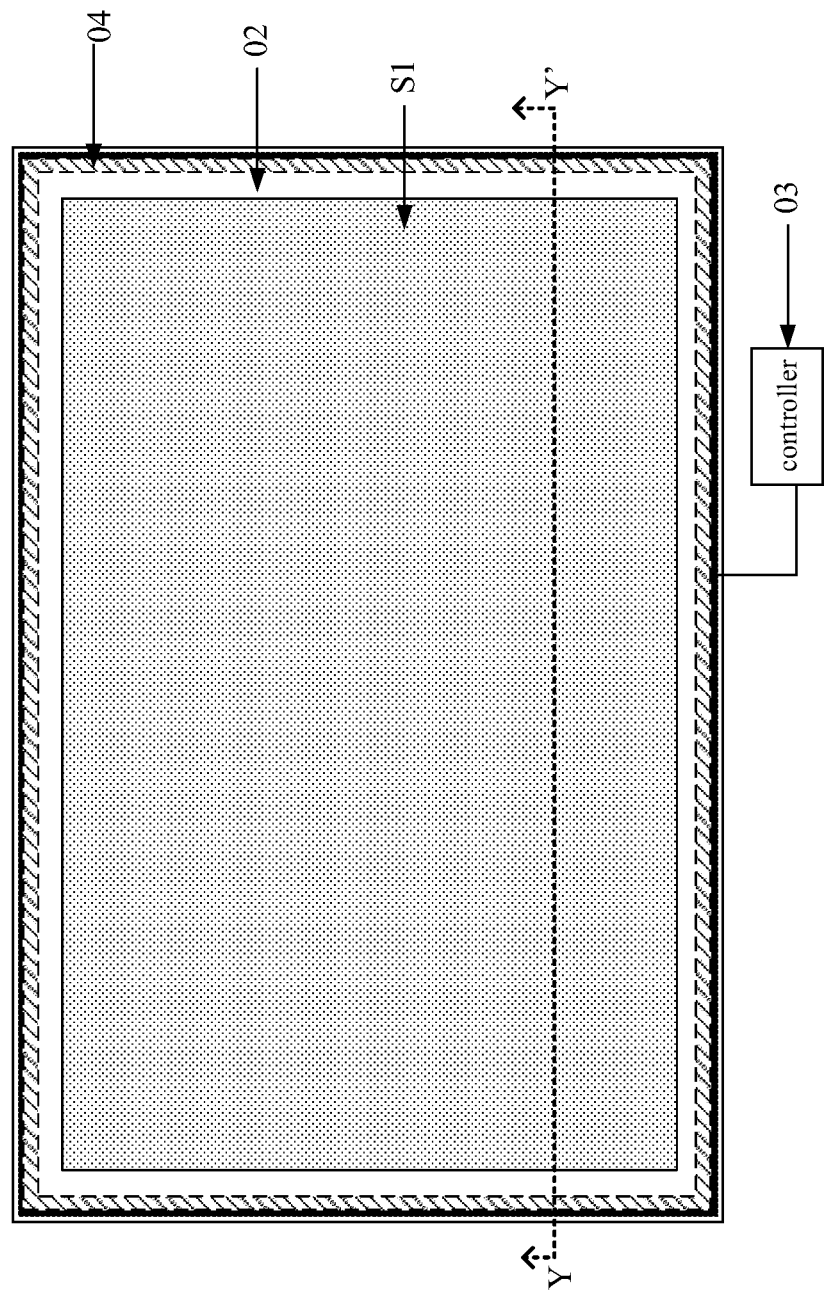
FIG. 9 is a structural diagram of another display module provided in an embodiment of the present disclosure.
Figure 10:
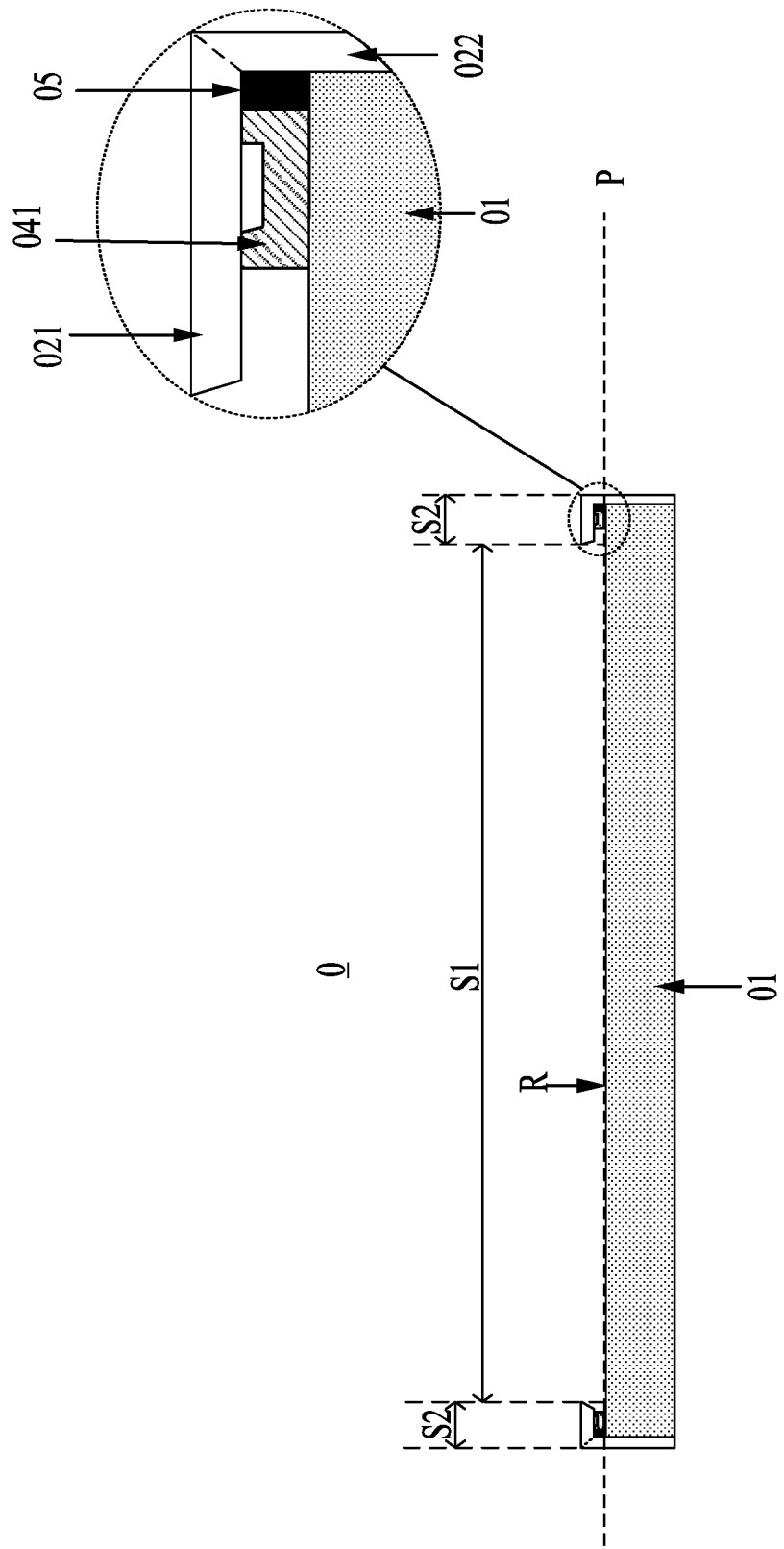
FIG. 10 is a section diagram of the display module shown in FIG. 9.

Further, FIG. 9 is a structural diagram of another display module provided in an embodiment of the present disclosure. FIG. 10 is a diagram of section YY' of the display module shown in FIG. 9 and this section YY' is perpendicular to the display screen 01 in the display module. With reference to FIGS. 9 and 10, on the basis of FIG. 1, the display module may further include a waterproof layer 05. It should be noted that, in FIGS. 9 and 10, the deformation component 041 in the waterproof assembly is shown while the heater and detector in the waterproof assembly are not shown.

In one aspect, as shown in FIG. 10, the edge of the deformation component 041 does not exceed the edge of the display screen 01. Namely, the orthographic projection of the deformation component 041 on a plane surface P of the light-emergent surface R of the display screen 01 is within the light-emergent surface R (such as within the non-display region S2 of the light-emergent surface R). At this time, the surface of the deformation component 041, close to the second portion 021 of the front module frame, may be provided with the waterproof layer 05. The waterproof layer 05 may prevent evaporated water from moving towards the edge of the display screen 01 when the deformation component 041 is heated, thereby preventing the water from entering the inside of the display screen 01. Exemplarily, the waterproof layer 05 may be made of polyethylene terephthalate. Exemplarily, the orthographic projection of the deformation component 041 on the plain surface P is ring-shaped and within the display screen. The surface of the deformation component 041, close to the edge of the display screen 01, may be an outer ring surface of the deformation component 041, i.e., the surface of the deformation component 041 away from the display region S1.

Figure 11:
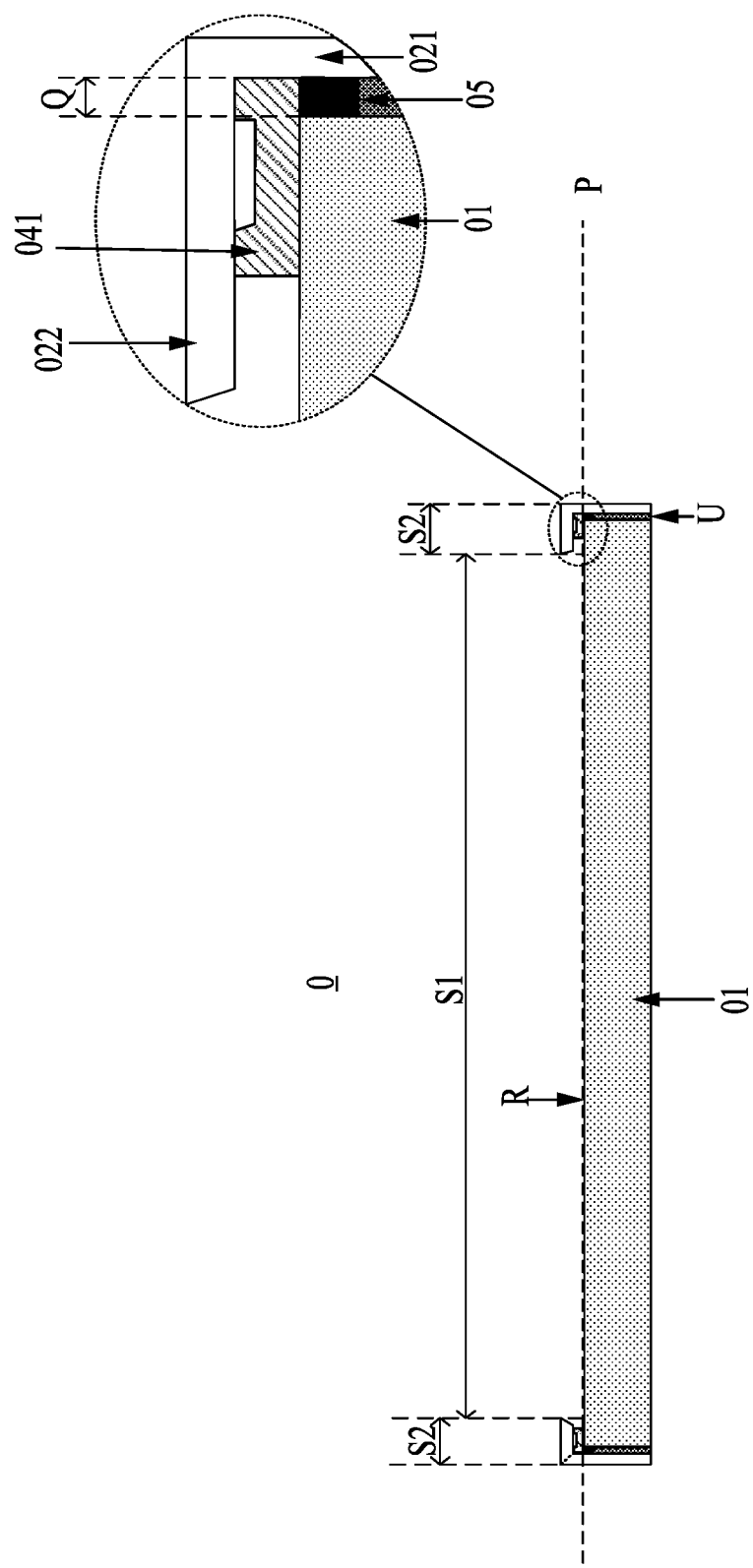
FIG. 11 is a diagram of the location of a waterproof layer provided in an embodiment of the present disclosure.

On the other hand, as shown in FIG. 11, the edge of the deformation component 041 may exceed the edge of the display screen 01. In this case, the deformation component 041 may include an edge portion Q, and an orthographic projection of the edge portion Q on a plane surface P of the light-emergent surface R of the display screen 01 is outside the light-emergent surface R. At this time, the orthographic projection of the edge portion Q on a plane surface P of the light-emergent surface R of the display screen 01 is not only outside the display region S1 but also outside the non-display region S2. For example, when there is a gap between the side surface of the display screen 01 and the second portion 022 of the front module frame (such as the gap where the waterproof layer 05 is located in FIG. 11, inside which a plastic frame U can be provided), the deformation component 041 includes an edge portion Q. In this case, the waterproof layer 05 may be located on the surface of the edge portion Q close to the display screen 01. At this time, the waterproof layer 05 can slow down the movement of the evaporated water to the edge of the display screen 01 when the deformation component 041 is heated, thereby reducing the water entering the inside of the display screen 01. It should be noted that, in FIG. 11, the deformation component 041 in the waterproof assembly is shown while the heater and detector in the waterproof assembly are not shown.

Optionally, the deformation component may further include a non-edge portion other than the edge portion, and the orthographic projection of the non-edge portion on the plane surface of the light-emergent surface may be within the light-emergent surface. At this time, the waterproof layer can effectively prevent the evaporated water from moving toward the edge of the display screen 01 when the deformation member is heated, thereby preventing water from entering the inside of the display screen 01.

Moreover, it should be noted that in the deformation component in the embodiments of the present disclosure, the surface in contact with the display screen may be an adherent surface. The surface opposite to the surface in contact with the display screen may also be an adherent surface. The deformation component is connected with the display screen and the front module frame through these two adherent surfaces.

In summary, in the display module provided in the embodiments of the present disclosure, when there is water on the surface of the display screen of the display module, and the water content in the gap between the display screen and the first portion is within a set water content range, the controller may control the waterproof assembly to heat the gap to remove the water in the gap, thereby preventing the water from entering the display screen. In addition, in this waterproof mode, there is no object attached to the display region of the surface of the display screen, which would not affect the display effect of the display screen.

It should be noted that, the present disclosure takes the arrangement in which the controller conducts the detection of water content in the gap through the deformation component and detector as an example, wherein the condition of the water content in the gap could be expressed as whether the water content in the gap is within a set water content range. Optionally, the controller may detect the water content in the gap through other manners. For instance, the controller may conduct the detection through a water sensor disposed in the gap. The present disclosure does not limit to this.

Figure 12:
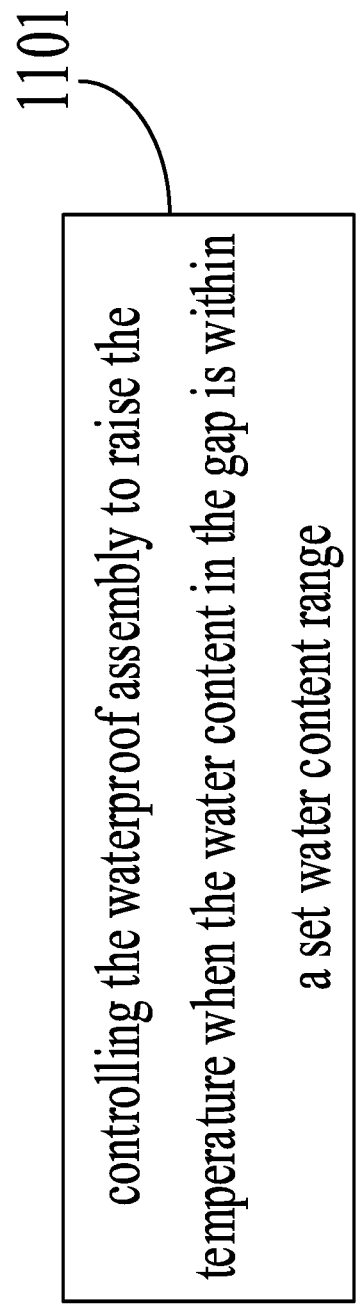
FIG. 12 is a flow chart of a control method for the waterproof assembly provided in an embodiment of the present disclosure.

FIG. 12 is a flow chart of a control method for the waterproof assembly provided in an embodiment of the present disclosure. The waterproof assembly can be the waterproof assembly in the display module. The control method for the waterproof assembly may be applied to the controller in the display module, which may be the display module in any of FIG. 1 to FIG. 10. As shown in FIG. 12, the control method may include the following steps.

Step 1101 includes controlling the waterproof assembly to raise the temperature when the water content in the gap is within a set water content range.

The above gap is the gap between the display screen and the first portion of the front module frame.

Optionally, the waterproof assembly may include a deformation component, a detector and a heater. On this basis, in step 1101, the controller may control the heater to heat the deformation component when the pressure detected by the detector is within a set pressure range, wherein the pressure detected by the detector correlates with the water content in the gap and the set pressure range correlates with the set water content range.

Optionally, the waterproof assembly may include m detectors 042 and n heaters 043. Each of the detectors corresponds to at least one of the heaters; m≥1 and n≥1. In step 1101, the controller may control, when determining that the pressure detected by certain detector is within the set pressure range, the heater corresponding to the detector to heat the deformation component. Optionally, the m detectors and the n heaters may be alternately arranged, and m≥1, n≥1.

In step 1101, the controller may control, when determining that the pressure received by any detector is within the set pressure range, the heater adjacent to said any detector to heat the deformation component.

Exemplarily, the heater may include a heat-conducting block and a heating resistor. The heating resistor is attached to the heat-conducting block and the surface area of the heat-conducting block is larger than that of the heating resistor. The heating resistor is connected with the controller. When needing to control the heater adjacent to said any detector to heat the deformation component, the controller may control the heating resistor in the heater adjacent to said any detector to generate heat, so that the heat-conducting block conducts the heat generated by the heating resistor to the deformation component, thereby completing heating on the deformation component.

It should be noted that the controller may continuously determine whether the pressure received by the detector is within the set pressure range. When the pressure received by any detector is within the set pressure range, the controller may control the heater, corresponding to the any detector, to heat the deformation component so as to remove the water in the deformation component. Once the pressure received by the any detector is not within the set pressure range, the controller may control the heater, corresponding to any detector, to stop heating the deformation component.

Optionally, the temperature, to which the controller controls the heater to heat the deformation component, does not exceed 60 degrees.

In summary, the embodiment of the present disclosure provides a control method of waterproof assembly. When there is water on the surface of the display screen of the display module, and the water content in the gap between the display screen and the first portion is within a set water content range, the controller may control the waterproof assembly to heat the gap to remove the water in the gap, thereby preventing the water from entering the display screen. In addition, in this waterproof mode, there is no object attached to the display region of the surface of the display screen, which would not affect the display effect of the display screen.

The embodiment of the present disclosure further provides a display device. The display device may include the display module as shown in any of FIGS. 1-9. The display device may be any product or component having a display function such as a liquid crystal display panel, electronic paper, an organic light-emitting diode panel, a mobile phone, a tablet computer, a television, a display, a laptop computer, a digital photo frame, a navigator and the like.

The embodiment of the present disclosure provides a use method for a display device. The display device may be the above display device. As shown in FIG. 13, the use method for the display device includes: step 1201: controlling, through the controller, the waterproof assembly to raise the temperature when the water content in the gap is within a set water content range.

The above gap is the gap between the display screen and the first portion of the front module frame. Step 1201 may make a reference to the process of step 1101 in which the controller determines whether the water content in the gap is within a set water content range. This is not repeated in the embodiments of the present disclosure.

In summary, the embodiment of the present disclosure provides a use method for a display device. When there is water on the surface of the display screen of the display module, and the water content in the gap between the display screen and the first portion is within a set water content range, the controller may control the waterproof assembly to heat the gap to remove the water in the gap, thereby preventing the water from entering the display screen. In addition, in this waterproof mode, there is no object attached to the display region of the surface of the display screen, which would not affect the display effect of the display screen.

The embodiment of the present disclosure further provides a computer-readable storage medium having instructions stored therein. When running on a computer, the computer-readable storage medium causes the computer to execute the method provided in FIG. 12 or 13.

The embodiment of the present disclosure further provides a computer program product containing instructions. When running on a computer, the computer program product causes the computer to execute the method provided in FIG. 12 or 13.

The embodiment of the present disclosure further provides a controller. The controller may include a processor and a memory. The processor is configured to execute instructions stored in the memory. The processor implements the method shown in FIG. 12 or 13 by executing the instructions.

Optionally, the controller may further include a network interface and a bus. The memory and the network interface are connected with the processor through the bus respectively. The controller may communicate with other devices through the network interface.

It should be noted that the method embodiments and the corresponding device embodiments provided in the embodiments of the present disclosure may make reference to one another. The embodiment of the present disclosure does not limit to this. The order of the steps of the method embodiment provided in the embodiments of the present disclosure may be adjusted properly and the steps may also be correspondingly increased or decreased according to the situation. Any change in methods that would be readily conceived by any person skilled in the art from the scope of the technology disclosed in the present disclosure should be within the scope of protection of the present disclosure and thus is not described herein.

The above description only relates to optional embodiments of the present disclosure, and the present disclosure does not limit to this. Any modifications, equivalents, improvements and the like made within the spirit and principles of the present disclosure should be included within the scope of protection of the present disclosure.

The singular form "a/an" and "one" herein are to be construed to include the plural form, unless otherwise clearly indicated in the context. In addition, the terms "comprise" and/or "include" used herein define the presence of a characteristic, integer, step, operation, unit and/or means as defined, but are not intended to rule out the presence or addition of one or more other characteristics, integers, steps, operations, units, means and/or combinations thereof.

Reference throughout this specification to "an embodiment", "some embodiments", "one embodiment", "another example", "an example", "a specific example" or "some examples" means that a particular feature, structure, material, or characteristic described in connection with the embodiment or example is included in at least one embodiment or example of the present disclosure. Thus, the appearances of the phrases such as "in some embodiments", "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

What is claimed is:

1. A display module, comprising a display screen, a front module frame, a waterproof assembly and a controller, wherein
    the front module frame comprises a first portion and a second portion; the first portion of the front module frame covers a non-display region of a light-emergent surface of the display screen; the second portion of the front module frame covers a side surface of the display screen;
    the waterproof assembly is located in the gap between the display screen and the first portion;
    the controller is configured to control the waterproof assembly to raise the temperature when the water content in the gap is within a set water content range.

2. The display module according to claim 1, the waterproof assembly comprises a deformation component, a detector and a heater;
    the detector and the deformation component are stacked between the display screen and the first portion of the front module frame in the direction perpendicular to the display screen; the deformation component is configured to deform after absorbing water; the detector is configured to detect pressure received by the detector itself; the heater is configured to heat the deformation component; and
    the controller is configured to control the heater to heat the deformation component when the pressure detected by the detector is within a set pressure range, wherein the pressure detected by the detector correlates with the water content in the gap and the set pressure range correlates with the set water content range.

3. The display module according to claim 2, wherein the deformation component is made of at least one of foam and silica gel.

4. The display module according to claim 2, wherein the detector comprises a pressure sensor.

5. The display module according to claim 2, wherein the heater comprises a heating resistor and a heat-conducting block;
    the heating resistor is attached to the heat-conducting block; the heat-conducting block is in contact with the deformation component; and the heating resistor is configured to generate heat under the control of the controller.

6. The display module according to claim 5, wherein the heat-conducting block is made of aluminium.

7. The display module according to claim 2, wherein an orthographic projection of the deformation component on a plane surface of the light-emergent surface is within the light-emergent surface, and the display module further comprises a waterproof layer, and the waterproof layer is located on the surface of the deformation component close to the second portion.

8. The display module according to claim 2, wherein an orthographic projection of an edge portion of the deformation component on a plane surface of the light-emergent surface is outside the light-emergent surface, and the display module further comprises a waterproof layer, and the waterproof layer is located on the surface of the edge portion close to the display screen.

9. The display module according to claim 2, wherein the waterproof assembly comprises m detectors and n heaters; each of the detectors corresponds to at least one of the heaters; m≥1 and n≥1; and
    the controller is configured to control, when determining that the pressure detected by any of the detectors is within the set pressure range, the heater corresponding to the detector to heat the deformation component.

10. The display module according to claim 9, wherein the distribution density of the n heaters is decreased along the direction towards the edge of the display screen.

11. The display module according to claim 9, wherein a distance between each of the detectors and the heater which corresponds to the detector is less than a distance between each of the detectors and a heater which does not correspond to the detector.

12. The display module according to claim 9, wherein the detectors and the heaters are alternately arranged.

13. The display module according to claim 2, wherein at least one of the side facing the first portion of the front module frame and the side facing the light-emergent surface of the display screen, in the deformation component, is provided with an accommodating groove, and the detectors and the heaters are located in the accommodating groove.

14. The display module according to claim 13, wherein the accommodating grooves in the deformation component comprise a first accommodating groove and a second accommodating groove which are located at the same side of the deformation component and spaced; the detector is embedded into the first accommodating groove;
    and the heater is embedded into the second accommodating groove.

15. The display module according to claim 2, wherein an orthographic projection of the deformation component on the display screen is ring-shaped and surrounds a display region of the display screen.

16. A control method for a waterproof assembly used in the controller in the display module of claim 1, wherein the waterproof assembly is a waterproof assembly in the display module; and the method comprises:
    controlling the waterproof assembly to raise the temperature when the water content in the gap is within a set water content range.

17. The control method according to claim 16, wherein the waterproof assembly comprises a deformation component, a detector and a heater;
    said controlling the waterproof assembly to raise the temperature when the water content in the gap is within a set water content range comprises:
    controlling the heater to heat the deformation component, when the pressure detected by the detector is within a set pressure range, wherein the pressure detected by the detector correlates with the water content in the gap and the set pressure range correlates with the set water content range.

18. A display device, comprising the display module of claim 1.

19. A computer-readable storage medium having an instruction stored therein, wherein when running on a computer, the computer-readable storage medium causes the computer to execute the method of claim 16.

20. A use method for a display device, wherein the display device is the display device of claim 18, and the method comprises:

controlling, through the controller, the waterproof assembly to raise the temperature when the water content in the gap is within a set water content range.

* * * * *